United States Patent [19]
Ishida et al.

[11] Patent Number: 6,143,632
[45] Date of Patent: Nov. 7, 2000

[54] DEUTERIUM DOPING FOR HOT CARRIER RELIABILITY IMPROVEMENT

[75] Inventors: Emi Ishida, Sunnyvale; Peng Fang, San Jose, both of Calif.

[73] Assignee: Advanced Micro Devices, Inc., Sunnyvale, Calif.

[21] Appl. No.: 08/993,049

[22] Filed: Dec. 18, 1997

[51] Int. Cl.[7] ............................................. H01L 29/76
[52] U.S. Cl. ..................... 438/543; 438/558; 438/565; 257/607
[58] Field of Search .................................... 438/217, 766, 438/38, 543, 558, 565; 428/404

[56] References Cited

U.S. PATENT DOCUMENTS 5,830,575  11/1998  Warren et al. ........................ 428/404
5,872,387  2/1999  Lyding et al. ........................ 438/38

OTHER PUBLICATIONS

J.W. Lyding et al., "Reduction Of Hot Electron Degradation In Metal Oxide Semiconductor Transistors By Deuterium Processing", Applied Physics Letter, vol. 68, No. 18, Apr. 29, 1996; Transistors pp. 2526–2528.

Primary Examiner—Olik Chaudhuri
Assistant Examiner—Anh Duy Mai

[57] ABSTRACT

A semiconductor device having reduced hot carrier degradation is achieved by doping the semiconductor substrate and gate oxide with deuterium. A conventional semiconductor device is formed with sequentially deposited metal layers and dielectric layers and a topside protective dielectric layer deposited thereon. Deuterium is introduced to the semiconductor device by using deuterium-containing reactants in at least one of the semiconductor manufacturing steps to passivate dangling silicon bonds at the silicon/oxide interface region.

6 Claims, 2 Drawing Sheets

DEUTERIUM DOPING FOR HOT CARRIER RELIABILITY IMPROVEMENT

CROSS-REFERENCE TO RELATED APPLICATIONS

This application is related to commonly-assigned, co-pending application Ser. No. 08/993,128, filed concurrently herewith, entitled DEUTERIUM IMPLANT AND ANNEAL FOR HOT CARRIER RELIABILITY IMPROVEMENT.

TECHNICAL FIELD

The present invention relates to a method of manufacturing a semiconductor device with improved, reliability. The present invention is particularly applicable in manufacturing high density semiconductor devices having design features of about 0.25 microns and under.

BACKGROUND ART

Conventional semiconductor devices typically comprise a semiconductor substrate, normally made of doped monocrystalline silicon, and a plurality of dielectric and conductive layers formed thereon. In a conventional semiconductor device 100 illustrated in FIG. 1, p-type substrate 1 is provided with field oxide 2 for isolating an active region comprising N+ source/drain regions 3, and a gate electrode 4, typically of doped polysilicon, above the semiconductor substrate with gate oxide 5 therebetween. Interlayer dielectric layer 6, typically silicon dioxide, is then deposited thereover and openings formed by conventional photolithographic and etching techniques. The openings are filled with conductive material to establish electrical contact between subsequently deposited conductive layer 8, typically of aluminum or an aluminum-base alloy, and source/drain regions 3 through contacts 7, and to transistor gate electrode 49. Dielectric layer 9, typically silicon dioxide, is deposited on conductive layer 8, and another conductive layer 10, typically aluminum or an aluminum-base alloy, formed on dielectric layer 9 and electrically connected to conductive layer 8 through vias 11.

With continued reference to FIG. 1, conductive layer 10 is the uppermost conductive layer and, hence, constitutes the wire bonding layer. Dielectric layer 12, also typically silicon dioxide, is deposited, and a protective dielectric scratch resistant topside layer 13 deposited thereon. Protective dielectric layer 13 typically comprises a nitride layer, such as silicon nitride ($Si_3N_4$). Alternatively, protective dielectric layer 13 may comprise a dual topcoat comprising a nitride layer on an oxide layer. The protective dielectric layer 13 provides scratch protection to the semiconductor device and protection against moisture and impurity contamination during subsequent processing. After deposition of protective dielectric layer 13, conventional photolithographic etching techniques are employed to form an opening to expose wire bonding layer 10 for external connection by means of bonding pad 14 and electrically conductive wires 15 or an external connection electrode (not shown).

Although only two conductive layers 8 and 10 are depicted in FIG. 1 for illustrative convenience, conventional semiconductor devices are not so limited and may comprise more than two conductive layers, depending on design requirements, e.g. five conductive metal layers. Also in the interest of illustrative convenience, FIG. 1 does not illustrate any particular type of plug or barrier layer technology. However, such technology is conventional and, therefore, the details of such features are not set forth herein.

Hydrogen is typically employed during several steps in the manufacturing of conventional semiconductor device 100. For example, during annealing of semiconductor device 100 after dielectric layer 13 is deposited, the furnace atmosphere often contains hydrogen. Hydrogen atoms from the furnace atmosphere diffuse through the semiconductor device and bond with "dangling", i.e., unbonded, silicon atoms at the interface between substrate 1 and gate oxide 5.

In semiconductor devices, particularly devices with design features of 0.25 microns and under, device performance degrades over time due to "hot carrier" effects. Hot carrier degradation occurs when the electric field generated by the supply voltage of the semiconductor device makes it possible for electrons at the transistor level to gain sufficient energy to be injected onto gate oxide 5, typically silicon dioxide ($SiO_2$). These "hot electrons" stimulate the desorption of hydrogen from the $Si/SiO_2$ interface of substrate 1 and gate oxide 5, by breaking hydrogen/silicon bonds. Over time, the silicon substrate 1 and gate oxide 5 become charged, thereby changing the electrical properties of the transistor. For example, the transistor threshold voltage may be raised and the transconductance reduced, thereby degrading the performance of the transistor.

One prior approach for reducing the hot carrier effects comprises annealing in a deuterium atmosphere after deposition of protective dielectric layer 13. Since deuterium atoms are heavier than hydrogen atoms, deuterium/silicon bonds are more difficult to break by hot electrons than the hydrogen/silicon bonds.

A drawback attendant upon introducing deuterium at the final annealing step is that the deuterium atoms may not diffuse through topside dielectric layer 13, typically a silicon nitride layer, quickly enough to reach the dangling silicon bonds at the $Si/SiO_2$ interface. Therefore, introducing deuterium at the final annealing step is often ineffective in passivating the dangling silicon bonds. If the temperature of the furnace is increased, to increase the rate of diffusion of the deuterium atoms through protective dielectric layer 13 and through the various metal and dielectric layers to the $Si/SiO_2$ interface, the metal layers as well as other previously defined layers can break down. Additionally, increasing the annealing time to allow the deuterium more time to diffuse to the $Si/SiO_2$ interface adds additional cost to the annealing process.

Therefore, a need exists for semiconductor methodology enabling reduction of hot carrier degradation. A particular need exists for semiconductor methodology enabling reduction of hot carrier effects without increasing the annealing time or temperature.

SUMMARY OF THE INVENTION

An object of the present invention is a method of manufacturing a semiconductor device that reduces hot carrier effects.

Another object of the present invention is a method of manufacturing a semiconductor device without increasing semiconductor annealing time or temperature, while reducing hot carrier effects.

Additional advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device. The method includes forming a first dielectric layer on an upper surface of a semiconductor substrate. The method also includes forming a first conductive layer on the first dielectric layer and sequentially depositing a plurality of dielectric layers and conductive layers above the semiconductor substrate. The method further includes doping the first dielectric layer and the semiconductor substrate with deuterium before forming an uppermost conductive layer. The deuterium passivates dangling silicon bonds at an interface of the substrate and the first dielectric layer.

Another aspect of the present invention is a method of manufacturing a semiconductor device that includes forming a first dielectric layer comprising silicon dioxide having a thickness of less than about 80 Å on an upper surface of a semiconductor substrate. The method also includes forming a first conductive layer comprising polycrystalline silicon on the dielectric layer and sequentially depositing a plurality of dielectric layers and conductive layers above the semiconductor substrate. The method further includes doping the first dielectric layer and the semiconductor substrate with deuterium before depositing an uppermost conductive layer, thereby passivating dangling silicon bonds at an interface of the substrate and the first dielectric layer.

Other objects and advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference numeral designations represent like elements throughout.

DETAILED DESCRIPTION OF ILLUSTRATED EMBODIMENTS

Figure 1:
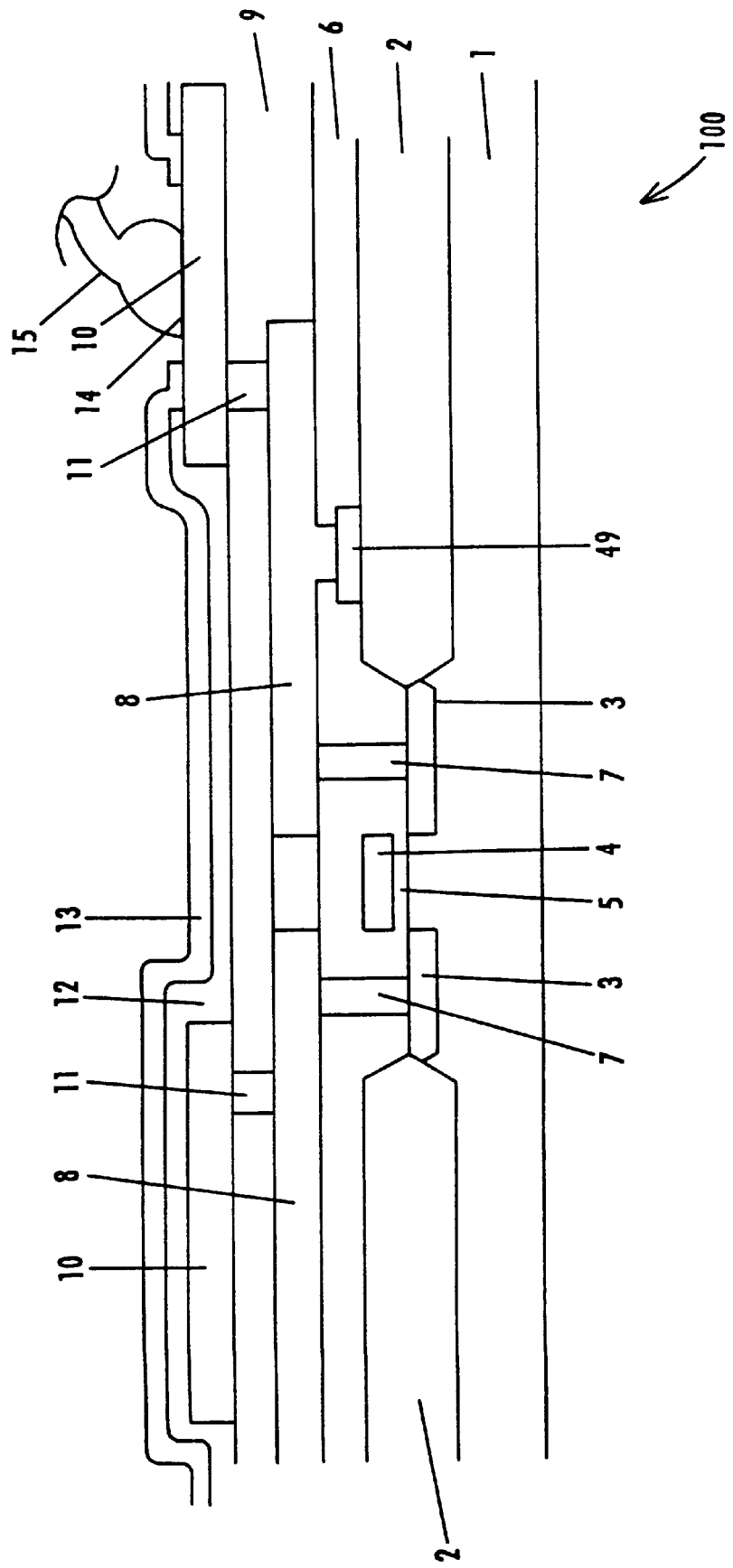
FIG. 1 illustrates the cross-section of a conventional semiconductor device.

The present invention will be described with the example of a conventional semiconductor device. A brief description will first be given of an exemplary semiconductor device used in accordance with embodiments of the present invention, followed by the detailed description of the method for doping the Si/SiO$_2$ interface regions with deuterium to improve hot carrier reliability. It will become apparent, however, that the present invention is also applicable to other semiconductor devices, as described in detail below.

WAFER ARCHITECTURE

As discussed earlier, FIG. 1 illustrates a conventional semiconductor device 100 with a p-type substrate 1 and two conductive layers 8 and 10. Gate oxide layer 5 comprises silicon dioxide (SiO$_2$) and is typically formed at a thickness of less than about 80 Å, e.g. about 30 Å to about 70 Å. Gate electrode 4 typically comprises polycrystalline silicon and is formed on gate oxide layer 5.

With reference to FIG. 1, after subsequent masking and etching, a plurality of sequential dielectric and conductive layers are deposited in accordance with the design characteristics of a particular integrated circuit. The various conductive patterns of different conductive layers are electrically connected by vias or plugs, while the conductive patterns of the first conductive layer are electrically connected to active regions in the semiconductor substrate by contacts.

Most problems associated with hot carrier degradation occur at the interface between silicon substrate 1 and SiO$_2$ gate oxide layer 5. As discussed supra, semiconductor device 100 is conventionally annealed in a hydrogen atmosphere, after protective dielectric layer 13 is deposited Hydrogen atoms bond with dangling, i.e., unbonded, silicon atoms in substrate 1 and gate oxide 5 as well as unbonded silicon atoms in gate electrode 4.

Hot electrons from the channel region may cause hydrogen/silicon bonds at the Si/SiO$_2$ interface to break, thereby changing the electrical properties of the transistor and degrading transistor performance. The polysilicon gate electrode 4 may also contain hydrogen/silicon bonds broken by hot electrons. Therefore, polysilicon gate electrode 4 may also be affected by hot electrons.

As discussed earlier, conventional approaches involve the use of a hydrogen atmosphere during annealing, after deposition of topside dielectric layer 13. Other approaches utilize a deuterium atmosphere during final annealing to passivate dangling silicon bonds.

However, deuterium atoms are heavier and take a longer period of time to diffuse through topside dielectric layer 13. Therefore, deuterium atoms do not effectively diffuse through dielectric layer 13 during annealing and, hence, do not reach and bond with the dangling silicon atoms at the interface between substrate 1 and gate oxide 5 or at gate electrode 4. Annealing at higher temperatures to increase the diffusion rate of the deuterium atoms results in breakdown of the previously defined layers, as well as other undesirable physical changes to semiconductor device 100. Additionally, annealing for longer time periods also produces undesirable changes to metal layers and dielectric layers, as well as consuming production time.

In accordance with embodiments of the present invention, these problems are effectively solved by a methodology which comprises introducing deuterium before the uppermost conductive layer is formed. FIG. 1 illustrates a cross-section of a semiconductor device 100 in which the present invention may be advantageously employed. Alternatively, semiconductor device 100 may contain more metal layers or less metal layers without departing from the concept of the invention. For example, a particular semiconductor device may contain five metal layers or more, based on the design requirements.

The present invention provides a cost effective, efficient methodology for reducing hot carrier degradation of a semiconductor device. In an embodiment of the present invention, substrate 1 and gate oxide 5 are doped with deuterium (D) employing doping dopant reactants. In another embodiment of the present invention, substrate 1 and gate oxide 5 are doped with deuterium by implanting deuterium into the semiconductor device at various stages during manufacturing. A description will first be given of doping the Si/SiO$_2$ interface region via the addition of dopant reactants followed by a description of doping the Si/SiO$_2$ interface via implantation of deuterium.

DEUTERIUM DOPING VIA DOPANT REACTANTS

Hydrogen is conventionally employed in many processing steps in the manufacturing of a conventional semiconductor device, such as semiconductor device 100. For example, gate oxide 5, typically silicon dioxide, is grown on the active areas of the semiconductor device 100. Conventional techniques grow gate oxide 5 by heating substrate 1 in an $H_2O$ vapor atmosphere. The resulting reaction is represented by:

$Si(solid)+2H_2O \rightarrow SiO_2(solid)+2H_2$.

In a first embodiment of the present invention, gate oxide 5 is grown in a $D_2O$ vapor atmosphere instead of the conventional $H_2O$ environment. The products of the reaction of silicon substrate 1 in the $D_2O$ atmosphere are $SiO_2$ and $D_2$. The deuterium formed in the gate oxide 5 growing step diffuses through gate oxide 5 to the $Si/SiO_2$ interface between substrate 1 and gate oxide 5. Deuterium bonds with dangling silicon atoms located at the $Si/SiO_2$ interface. These silicon/deuterium bonds are more difficult for hot electrons to break than silicon/hydrogen bonds, thereby effectively reducing hot carrier degradation.

Figure 2:
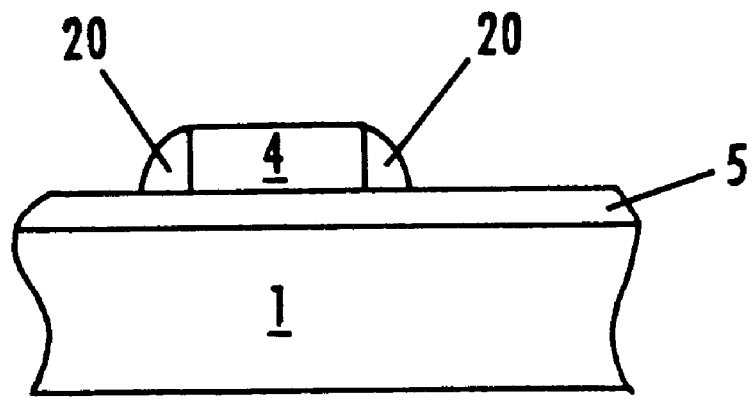
FIG. 2 illustrates the formation of sidewall spacers in the semiconductor device of FIG. 1.

Alternatively, embodiments of the present invention comprise doping silicon substrate 1 and gate oxide 5 with deuterium during formation of dielectric sidewall spacers on the side surfaces of gate electrode 4. The sidewall spacers are formed by depositing a layer of insulating material, such as silicon oxide, silicon nitride or a silicon oxynitride, e.g., by chemical vapor deposition (CVD), above gate electrode 4. The insulating layer is then anisotropically etched to form sidewall spacers 20, as shown in FIG. 2.

In forming sidewall spacers 20 comprising silicon dioxide, the reactants employed to deposit the $SiO_2$ layer can be silane ($SiH_4$) and $O_2$. Alternatively, any other known reaction involving a silicon/hydrogen compound to deposit $SiO_2$ can be used. Typically, the reaction of $SiH_4$ and $O_2$ occurs at about 400°–500° C. forming $SiO_2$ and $H_2$. In embodiments of the present invention, silane ($SiH_4$) is replaced with a silicon/deuterium compound, such as $SiD_4$. In this manner, the resulting reaction yields $SiO_2$ and deuterium. The deuterium formed during deposition of sidewall spacers 20 diffuses through gate oxide 5 to the $Si/SiO_2$ interface between substrate 1 and gate oxide 5 and bonds with dangling silicon atoms located at the $Si/SiO_2$ interface. Additionally, the deuterium bonds with dangling silicon atoms at the $Si/SiO_2$ interface between gate oxide 5 and gate electrode 4. As discussed supra, these silicon/deuterium bonds are more difficult for hot electrons to break than silicon/hydrogen bonds, thereby effectively reducing hot carrier degradation.

Alternatively, in accordance with embodiments of the invention, any conventional reaction used in the manufacturing process of semiconductor device 100, before uppermost conductive layer 10 is formed, that employs hydrogen or a hydrogen-containing compound as a reactant can replace the hydrogen or hydrogen-containing compound with a deuterium species or a deuterium-containing compound. The ensuing reaction provides the desired chemical deposition, as described above, along with a reaction product deuterium species. The reaction product deuterium species then diffuses to the interface between substrate 1 and gate oxide 5, as well as between gate oxide 5 and gate electrode 4, to form bonds with dangling silicon atoms at the $Si/SiO_2$ interfaces, thereby reducing hot carrier degradation. The particular deuterium species as well as the concentration levels of the deuterium used in any of the above process steps can be readily determined to optimize the reduction in hot carrier effects.

For example, in forming a relatively thick gate oxide layer 5 on a particular semiconductor structure, the concentration of the deuterium species would be increased to ensure that the deuterium species can adequately diffuse to the $Si/SiO_2$ interface regions to passivate the dangling silicon bonds.

By introducing deuterium to semiconductor device 100 prior to the formation of uppermost conductive layer 10, the present invention enables diffusion of deuterium through semiconductor device 100 to the $Si/SiO_2$ interface regions to passivate the dangling silicon bonds. The use of deuterium as a dopant reactant provides an efficient methodology for reducing hot carrier degradation without increasing manufacturing time.

DEUTERIUM DOPING VIA IMPLANTATION

In accordance with another embodiment of the present invention, substrate 1 and gate oxide 5 are doped with deuterium by implanting deuterium into the semiconductor device before topside dielectric layer 13 is deposited. The deuterium, typically derived from a gaseous deuterium source, is implanted under conditions sufficient to passivate dangling silicon bonds. For example, a gaseous deuterium source containing D, $D_2$, or any other deuterium species may be used. The gaseous deuterium species is ionized and implanted under suitable conditions into the semiconductor device.

Figure 3:
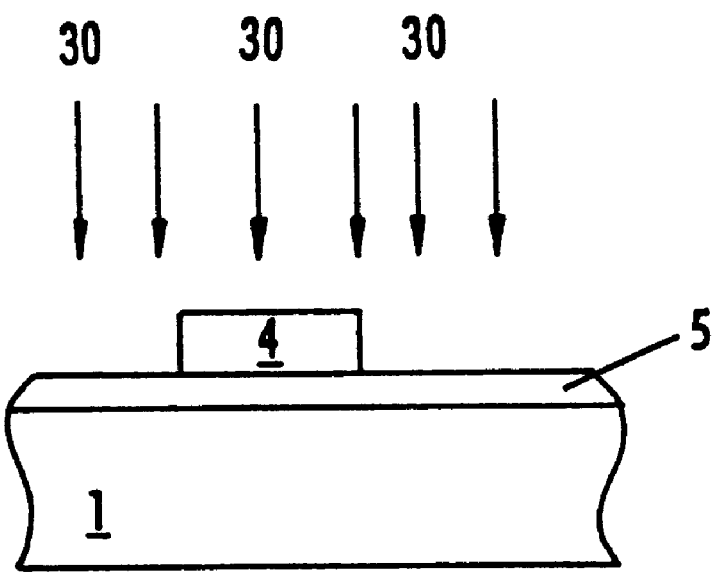
FIG. 3 illustrates the method of implanting deuterium in the semiconductor device of FIG. 1 in accordance with an embodiment of the present invention.

FIG. 3 schematically illustrates a method of implanting deuterium atoms according to an embodiment of the present invention. Adverting to FIG. 3, arrows 30 indicate the step of implanting deuterium. In the illustrated embodiment, $D^+$ is implanted at sufficient implantation dosage and energy, after polysilicon gate electrode 4 is formed, to passivate dangling silicon bonds and reduce hot carrier degradation. Gate oxide 5 comprises silicon dioxide ($SiO_2$) formed at a thickness of less than about 80 Å, e.g. about 30 Å to about 70 Å and gate electrode 4 comprises polycrystalline silicon formed on gate oxide layer 5. The optimum implantation dosage and energy can be readily determined for a particular situation. The actual dosage and implantation energy are selected for optimization based on the particular semiconductor structure. For example, if gate oxide 5 is relatively thick, the implantation energy level may increase in order to ensure that the deuterium atoms reach the $Si/SiO_2$ interface.

In alternative embodiments, the deuterium implantation can be performed before forming the gate electrode 4, and even before growing gate oxide 5. In this manner, deuterium can be implanted directly or substantially directly into the substrate surface.

A further embodiment of the present invention comprises implanting deuterium at any stage during semiconductor fabrication prior to depositing the topside dielectric layer 13. For example, deuterium can be implanted after the sequential deposition of dielectric layers 6 and 9 and conductive layers 8 and 10. The implantation energy required to implant the deuterium to the $Si/SiO_2$ interface regions of the semiconductor device after the deposition of conductive layer 10 may be greater than the implantation energy required for the embodiment illustrated in FIG. 3. However, the implantation energy required is lessened by implanting the deuterium prior to the deposition of topside dielectric layer 13, thereby avoiding the energy requirements associated with penetrating layer 13.

The implantation depth of deuterium depends on the availability of high energy implant capabilities. If high energy implant capabilities exist, the implantation depth for any of the embodiments can be the $Si/SiO_2$ interface region at the surface of substrate 1. However, if high energy implant capabilities do not exist, conventional annealing steps in the semiconductor manufacturing process allow the implanted deuterium to diffuse to the substrate surface.

After the Si/SiO$_2$ interface regions have been doped, via the dopant reactants or via implantation, the conventional steps remaining in the manufacturing of semiconductor device 100 proceed as discussed supra. After topside dielectric layer 13 is formed, the semiconductor device is annealed. In the depicted embodiment for semiconductor device 100, the annealing process is performed at about 400° C. to about 550° C. for 30 minutes. However, the particular annealing time and temperature depend on the particular semiconductor device. The annealing step is performed employing a furnace conventionally employed for annealing semiconductor devices. In the depicted embodiment, the annealing step is performed in a deuterium atmosphere, thereby enhancing the diffusion of deuterium through topside dielectric layer 13 to passivate dangling silicon bonds.

Alternatively, the annealing step can be performed in an inert atmosphere, such as argon. A further alternative comprises annealing in an N$_2$ atmosphere. However, the annealing step should not be done in a hydrogen ambient, since hydrogen atoms will compete with deuterium for the dangling silicon bonds.

After the annealing step has been performed, the implanted deuterium and the deuterium from the furnace ambient, if a deuterium ambient was used, are bonded with dangling silicon atoms at the substrate level and the gate electrode level. These silicon/deuterium bonds are harder for hot electrons to break than silicon/hydrogen bonds, thereby reducing hot carrier effects.

Described has been method for reducing hot carrier effects. An advantage of the invention is that hot carrier degradation of the semiconductor is reduced without increasing the annealing time of the semiconductor device. Another advantage of the invention is that the annealing temperature of the semiconductor device does not have to be increased, thereby saving manufacturing costs.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

The dielectric and conductive layers utilized in manufacturing a semiconductor device in accordance with the present invention can be deposited by conventional deposition techniques. For example, metallization techniques such as various types of chemical vapor deposition (CVD) processes, including low pressure chemical vapor deposition (LPCVD) and enhanced chemical vapor deposition (ECVD) can be employed.

The present invention enjoys applicability in the manufacturing of semiconductor devices and particularly in semiconductor devices comprising design features of 0.25 microns and under, with increased transistor and circuit speeds and improved reliability. The present invention is applicable to the formation of any of various types of semiconductor devices and, hence, details have not been set forth herein in order to avoid obscuring the thrust of the present invention. In practicing the present invention, conventional photolithographic and etching techniques are employed and, hence, the details of such techniques have not been set forth herein in detail.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:

forming a first dielectric layer on an upper surface of a semiconductor substrate;

forming a first conductive layer on the first dielectric layer;

sequentially depositing a plurality of dielectric layers and conductive layers above the semiconductor substrate; and doping the first dielectric layer and the semiconductor substrate with deuterium before depositing an uppermost conductive layer, thereby passivating dangling silicon bonds at an interface of the substrate and the first dielectric layer, wherein the doping step comprises:

heating the semiconductor substrate in a deuterium vapor atmosphere to form the first dielectric layer.

2. A method of manufacturing a semiconductor device, which method comprises:

forming a first dielectric layer on an upper surface of a semiconductor substrate;

forming a first conductive layer comprising a gate electrode on the first dielectric layer;

sequentially depositing a plurality of dielectric layers and conductive layers above the semiconductor substrate; and doping the first dielectric layer and the semiconductor substrate with deuterium before depositing an uppermost conductive layer, thereby passivating dangling silicon bonds at an interface of the substrate and the first dielectric layer, wherein the doping step comprises:

depositing a dielectric sidewall spacer on the gate electrode, wherein one of the reactants comprises a silicon/deuterium compound.

3. The method of claim 2, comprising reacting SiD$_4$ and O$_2$.

4. A method of manufacturing a semiconductor device, which method comprises:

forming a first dielectric layer comprising silicon dioxide having a thickness of less than about 80Å on an upper surface of a semiconductor substrate;

forming a first conductive layer comprising polycrystalline silicon on the dielectric layer; and sequentially depositing a plurality of dielectric layers and conductive layers above the semiconductor substrate; and doping the first dielectric layer and the semiconductor substrate with deuterium before depositing an uppermost conductive layer, thereby passivating dangling silicon bonds at an interface of the substrate and the first dielectric layer, wherein the doping step comprises:

heating the semiconductor substrate in a deuterium vapor atmosphere to form the first dielectric layer.

5. A method of manufacturing a semiconductor device, which method comprises:

forming a first dielectric layer comprising silicon dioxide having a thickness of less than about 80Å on an upper surface of a semiconductor substrate;

forming a first conductive layer comprising polycrystalline silicon on the dielectric layer, the first conductive layer comprising a gate electrode; and sequentially depositing a plurality of dielectric layers and conductive layers above the semiconductor substrate; and doping the first dielectric layer and the semiconductor substrate with deuterium before depositing an uppermost conductive layer, thereby passivating dangling silicon bonds at an interface of the substrate and the first dielectric layer, wherein the doping step comprises:

depositing a dielectric sidewall spacer on the gate electrode, wherein one of the reactants comprises a silicon/deuterium compound.

6. The method of claim 5, comprising reacting $SiD_4$ and $O_2$.

* * * * *